(12) United States Patent
Fischer et al.

(10) Patent No.: US 8,443,756 B2
(45) Date of Patent: *May 21, 2013

(54) SHOWERHEAD ELECTRODES AND SHOWERHEAD ELECTRODE ASSEMBLIES HAVING LOW-PARTICLE PERFORMANCE FOR SEMICONDUCTOR MATERIAL PROCESSING APPARATUSES

(75) Inventors: Andreas Fischer, Castro Valley, CA (US); Rajinder Dhindsa, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/284,297

(22) Filed: Oct. 28, 2011

(65) Prior Publication Data

US 2012/0045902 A1 Feb. 23, 2012

Related U.S. Application Data

(63) Continuation of application No. 11/730,298, filed on Mar. 30, 2007, now Pat. No. 8,069,817.

(51) Int. Cl.

| C23C 16/509 | (2006.01) |
| C23C 16/50 | (2006.01) |
| C23C 16/448 | (2006.01) |
| C23F 1/00 | (2006.01) |
| H01L 21/306 | (2006.01) |
| H05H 1/24 | (2006.01) |
| H01L 21/00 | (2006.01) |
| C23C 16/06 | (2006.01) |
| C23C 16/22 | (2006.01) |

(52) U.S. Cl.
USPC .............. 118/723 E; 118/723 R; 156/345.43; 156/345.45; 427/569; 427/533; 427/534; 427/535; 438/485; 438/798

(58) Field of Classification Search
USPC ......... 118/723 E, 723 R; 156/345.43, 345.45; 427/569, 533, 534, 535; 438/485, 798
See application file for complete search history.

(56) References Cited

U.S. PATENT DOCUMENTS

| 3,818,584 A | 6/1974 | Suenaga et al. |
| 4,931,135 A * | 6/1990 | Horiuchi et al. ................ 216/67 |

(Continued)

FOREIGN PATENT DOCUMENTS

| JP | 57037821 A | * | 3/1982 |
| JP | 60128653 A | * | 7/1985 |

(Continued)

OTHER PUBLICATIONS

Japanese Official Action mailed May 21, 2012 for Japanese Appln. No. 2010-500976 (partial translation included).

(Continued)

Primary Examiner — Rudy Zervigon
(74) Attorney, Agent, or Firm — Buchanan Ingersoll & Rooney PC

(57) ABSTRACT

Showerhead electrodes for a semiconductor material processing apparatus are disclosed. An embodiment of the showerhead electrodes includes top and bottom electrodes bonded to each other. The top electrode includes one or more plenums. The bottom electrode includes a plasma-exposed bottom surface and a plurality of gas holes in fluid communication with the plenum. Showerhead electrode assemblies including a showerhead electrode flexibly suspended from a top plate are also disclosed. The showerhead electrode assemblies can be in fluid communication with temperature-control elements spatially separated from the showerhead electrode to control the showerhead electrode temperature. Methods of processing substrates in plasma processing chambers including the showerhead electrode assemblies are also disclosed.

9 Claims, 3 Drawing Sheets

U.S. PATENT DOCUMENTS

| | | | |
|---|---|---|---|
| 5,074,456 A * | 12/1991 | Degner et al. | 228/121 |
| 5,302,964 A | 4/1994 | Lewins | |
| 5,536,330 A | 7/1996 | Chen et al. | |
| 5,569,356 A * | 10/1996 | Lenz et al. | 438/729 |
| 5,569,358 A | 10/1996 | Cameron | |
| 5,595,606 A * | 1/1997 | Fujikawa et al. | 118/725 |
| 5,754,391 A * | 5/1998 | Bates | 361/234 |
| 5,766,364 A * | 6/1998 | Ishida et al. | 118/725 |
| 5,871,586 A * | 2/1999 | Crawley et al. | 118/715 |
| 5,882,411 A | 3/1999 | Zhao et al. | |
| 5,910,221 A * | 6/1999 | Wu | 118/723 R |
| 5,950,925 A * | 9/1999 | Fukunaga et al. | 239/132.3 |
| 5,998,932 A | 12/1999 | Lenz | |
| 6,063,441 A | 5/2000 | Koai et al. | |
| 6,086,677 A * | 7/2000 | Umotoy et al. | 118/715 |
| 6,123,775 A | 9/2000 | Hao et al. | |
| 6,153,013 A * | 11/2000 | Sakai et al. | 118/719 |
| 6,245,192 B1 * | 6/2001 | Dhindsa et al. | 156/345.34 |
| 6,387,182 B1 * | 5/2002 | Horie et al. | 118/244 |
| 6,477,980 B1 | 11/2002 | White et al. | |
| 6,506,254 B1 | 1/2003 | Bosch et al. | |
| 6,586,886 B1 * | 7/2003 | Katz et al. | 315/111.21 |
| 6,758,941 B1 * | 7/2004 | Ookawa et al. | 156/345.47 |
| 6,772,827 B2 | 8/2004 | Keller et al. | |
| 6,786,175 B2 * | 9/2004 | Dhindsa et al. | 118/723 E |
| 6,818,096 B2 * | 11/2004 | Barnes et al. | 156/345.43 |
| 6,830,007 B2 * | 12/2004 | Matsuki et al. | 118/723 ER |
| 6,838,012 B2 | 1/2005 | Lenz | |
| 6,846,726 B2 | 1/2005 | Ren et al. | |
| 6,849,241 B2 * | 2/2005 | Dauelsberg et al. | 423/328.2 |
| 6,863,020 B2 * | 3/2005 | Mitrovic et al. | 118/723 E |
| 6,890,861 B1 | 5/2005 | Bosch | |
| 6,905,079 B2 * | 6/2005 | Kuwada et al. | 239/13 |
| 6,983,892 B2 * | 1/2006 | Noorbakhsh et al. | 239/67 |
| 6,991,999 B2 | 1/2006 | Fu et al. | |
| 7,033,444 B1 | 4/2006 | Komino et al. | |
| 7,196,283 B2 * | 3/2007 | Buchberger et al. | 219/121.43 |
| 7,201,942 B2 * | 4/2007 | Jurgensen et al. | 427/248.1 |
| 7,270,713 B2 | 9/2007 | Blonigan et al. | |
| RE39,969 E * | 1/2008 | Okayama et al. | 156/345.34 |
| RE40,046 E * | 2/2008 | Okayama et al. | 29/745 |
| 7,430,986 B2 * | 10/2008 | Dhindsa et al. | 118/723 E |
| 7,482,550 B2 * | 1/2009 | Larson et al. | 219/121.43 |
| 7,494,561 B2 * | 2/2009 | Koshiishi et al. | 156/345.47 |
| 7,543,547 B1 * | 6/2009 | Kennedy et al. | 118/723 E |
| 7,585,386 B2 * | 9/2009 | Okumura et al. | 156/345.51 |
| 7,615,131 B2 * | 11/2009 | Lim | 156/345.43 |
| 7,619,179 B2 * | 11/2009 | Hayashi | 219/121.52 |
| 7,645,341 B2 * | 1/2010 | Kennedy et al. | 118/715 |
| 7,682,946 B2 * | 3/2010 | Ma et al. | 438/481 |
| 7,712,434 B2 * | 5/2010 | Dhindsa et al. | 118/723 E |
| 7,850,779 B2 * | 12/2010 | Ma et al. | 118/715 |
| 7,875,824 B2 * | 1/2011 | Larson et al. | 219/121.43 |
| 7,895,970 B2 * | 3/2011 | Honda et al. | 118/723 E |
| 8,069,817 B2 * | 12/2011 | Fischer et al. | 118/723 E |
| 2001/0027026 A1 * | 10/2001 | Dhindsa et al. | 438/712 |
| 2002/0127853 A1 | 9/2002 | Hubacek et al. | |
| 2002/0150519 A1 * | 10/2002 | Barnes et al. | 422/186.04 |
| 2002/0170676 A1 * | 11/2002 | Mitrovic et al. | 156/345.47 |
| 2003/0032301 A1 | 2/2003 | Dhindsa et al. | |
| 2003/0047282 A1 * | 3/2003 | Sago et al. | 156/345.34 |
| 2003/0054099 A1 * | 3/2003 | Jurgensen et al. | 427/248.1 |
| 2003/0094238 A1 * | 5/2003 | Strang et al. | 156/345.48 |
| 2004/0074609 A1 | 4/2004 | Fischer et al. | |
| 2004/0108068 A1 * | 6/2004 | Senzaki et al. | 156/345.43 |
| 2004/0169162 A1 | 9/2004 | Xiao et al. | |
| 2005/0133160 A1 * | 6/2005 | Kennedy et al. | 156/345.34 |
| 2005/0173067 A1 * | 8/2005 | Lim | 156/345.32 |
| 2005/0255241 A1 * | 11/2005 | Murakami et al. | 427/248.1 |
| 2006/0105104 A1 | 5/2006 | Tada | |
| 2006/0141802 A1 | 6/2006 | Shih et al. | |
| 2006/0207502 A1 * | 9/2006 | Dhindsa et al. | 118/715 |
| 2006/0288934 A1 * | 12/2006 | Takahashi et al. | 118/715 |
| 2007/0066038 A1 | 3/2007 | Sadjadi et al. | |
| 2007/0068629 A1 * | 3/2007 | Shih et al. | 156/345.34 |
| 2007/0163501 A1 | 7/2007 | Ohmi et al. | |
| 2007/0235660 A1 * | 10/2007 | Hudson | 250/423 P |
| 2008/0087641 A1 * | 4/2008 | De La Llera et al. | 216/67 |
| 2008/0090417 A1 * | 4/2008 | De La Llera et al. | 438/689 |
| 2008/0141941 A1 * | 6/2008 | Augustino et al. | 118/723 R |
| 2008/0242085 A1 * | 10/2008 | Fischer et al. | 438/680 |
| 2008/0308228 A1 * | 12/2008 | Stevenson et al. | 156/345.34 |
| 2009/0081878 A1 * | 3/2009 | Dhindsa | 438/729 |
| 2009/0111276 A1 * | 4/2009 | Dhindsa et al. | 438/710 |
| 2009/0127234 A1 * | 5/2009 | Larson et al. | 219/121.43 |
| 2009/0163034 A1 * | 6/2009 | Larson et al. | 438/729 |
| 2009/0211085 A1 * | 8/2009 | Kennedy et al. | 29/825 |

FOREIGN PATENT DOCUMENTS

| | | |
|---|---|---|
| JP | H09-067685 A | 3/1997 |
| JP | 2005-303329 A | 10/2005 |
| KR | 2000-0028097 A | 5/2000 |

OTHER PUBLICATIONS

International Search Report and Written Opinion dated Aug. 11, 2008 for PCT/US2008/003970.

Written Opinion mailed Feb. 18, 2010 for Singapore Appln. No. 2009063678.

Written Opinion mailed Feb. 18, 2010 for Singapore Appln. No. 2009063660.

Examination Report mailed Oct. 22, 2010 for Singapore Appln. No. 2009063678.

Official Action mailed Nov. 9, 2012 for Japanese Patent Appln. No. 2010-500976.

* cited by examiner

SHOWERHEAD ELECTRODES AND SHOWERHEAD ELECTRODE ASSEMBLIES HAVING LOW-PARTICLE PERFORMANCE FOR SEMICONDUCTOR MATERIAL PROCESSING APPARATUSES

CROSS-REFERENCE TO RELATED APPLICATIONS

This application is a continuation application of U.S. application Ser. No. 11/730,298 entitled SHOWERHEAD ELECTRODES AND SHOWERHEAD ELECTRODE ASSEMBLIES HAVING LOW-PARTICLE PERFORMANCE FOR SEMICONDUCTOR MATERIAL PROCESSING APPARATUSES, filed on Mar. 30, 2007, now U.S. Pat. No. 8,069,817 the entire content of which is hereby incorporated by reference.

BACKGROUND

In the field of semiconductor material processing, semiconductor material processing apparatuses including vacuum processing chambers are used, for example, for etching and chemical vapor deposition (CVD) of various materials on substrates, and for resist stripping. Some of these processes utilize corrosive and erosive process gases and plasma in such processing chambers. It is desirable to minimize particle and/or metal contamination of substrates processed in the chambers. Accordingly, it is desirable that process-exposed components of such apparatuses have low-particle performance.

SUMMARY

An exemplary embodiment of a showerhead electrode for a semiconductor material processing apparatus comprises a top electrode of semiconductor material comprising a top surface, a gas inlet at the top surface and a bottom surface, the bottom surface including at least one plenum in fluid communication with the gas inlet; and a bottom electrode of semiconductor material comprising a top surface bonded to the bottom surface of the top electrode, a plasma-exposed bottom surface, and a plurality of gas holes extending therethrough in fluid communication with the plenum.

An exemplary embodiment of a showerhead electrode assembly for a semiconductor material processing apparatus comprises a top plate including a bottom surface, a first gas passage adapted to be in fluid communication with a process gas supply section and a heating gas supply section, and a second gas passage adapted to be in fluid communication with a heat transfer gas supply section; and a showerhead electrode flexibly suspended from the top plate, the showerhead electrode comprising a top surface spaced from the bottom surface of the top plate by a gap in fluid communication with the second passage but not with the first passage, a plasma-exposed bottom surface including gas holes, a gas manifold in fluid communication with the first gas passage and the gas holes but not with the second gas passage.

An exemplary embodiment of a method of processing a semiconductor substrate in a plasma processing chamber comprising a showerhead electrode assembly including showerhead electrode comprises supplying a pre-heated heating gas from a heating gas supply section to the showerhead electrode via a first gas passage in the showerhead electrode assembly to heat the showerhead electrode; terminating the supply of the heating gas to the showerhead electrode; supplying a process gas from a process gas supply section to the showerhead electrode via the first gas passage; energizing the process gas to generate plasma in the plasma processing chamber to plasma process a substrate disposed on a substrate support in the plasma processing chamber; and supplying a heat transfer gas from a heat transfer gas supply section to the showerhead electrode assembly via a second gas passage in the showerhead electrode assembly to transfer heat from the showerhead electrode during generation of the plasma, wherein the first gas passage is flow isolated from the second gas passage.

DRAWINGS

DETAILED DESCRIPTION

Showerhead electrodes and showerhead electrode assemblies for semiconductor material plasma processing apparatuses, and methods of processing semiconductor materials in plasma processing chambers including embodiments of the showerhead electrode assemblies are described. The showerhead electrode assemblies provide low-particle performance with electrode temperature control. The showerhead electrode assemblies have a modular design. Some embodiments of the showerhead electrode assemblies have multi-zone gas injection capabilities.

Figure 1:
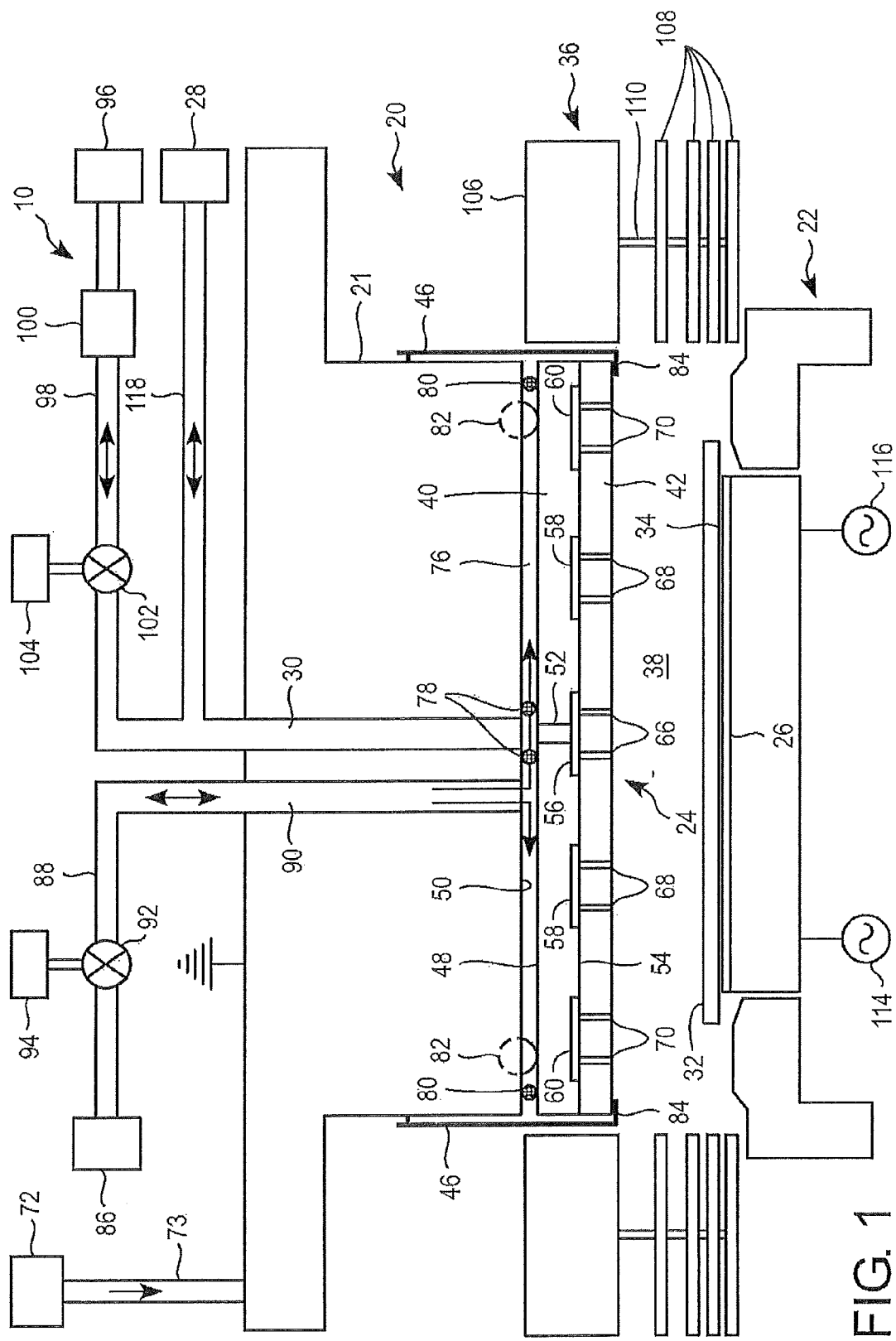
FIG. 1 illustrates an exemplary embodiment of a plasma processing chamber.

FIG. 1 depicts an exemplary embodiment of a capacitively-coupled plasma processing chamber 10 of a plasma processing apparatus for processing semiconductor material substrates, such as semiconductor wafers having a 200 mm or 300 mm diameter, for example. As shown, a showerhead electrode assembly 20 is arranged above a substrate support assembly 22. The showerhead electrode assembly 20 includes a top plate 21 and a showerhead electrode 24, and the substrate support assembly 22 includes a lower electrode 26. The plasma processing chamber 10 includes a process gas supply section with a process gas supply 28 adapted to supply process gas to the showerhead electrode 24 via a gas passage 30 in the top plate 21. During plasma processing, power is supplied to the lower electrode 26 to activate process gas introduced into the plasma processing chamber 10 and produce plasma to process a substrate 32 supported on the surface 34 of the substrate support assembly 22. As shown, the embodiment of the plasma processing chamber includes a plasma confinement ring assembly 36 constructed to confine the plasma within a plasma confinement zone 38 defined between the showerhead electrode 24 and substrate support assembly 22.

In the embodiment, the showerhead electrode 24 includes a top electrode 40 attached to a bottom electrode 42. The top electrode 40 and bottom electrode 42 are typically circular plates. The showerhead electrode 24 is suspended from the top plate 21 by brackets 46, such that the top surface 48 of the top electrode 40 is spaced from the bottom surface 50 of the top plate 21. The brackets 46 can be fastened to the top plate 21 and showerhead electrode 24. In another embodiment, the brackets 46 can be fastened to the top plate 21, but not attached to the showerhead electrode 24, such that the showerhead electrode 24 rests on the brackets 46.

Figure 2:
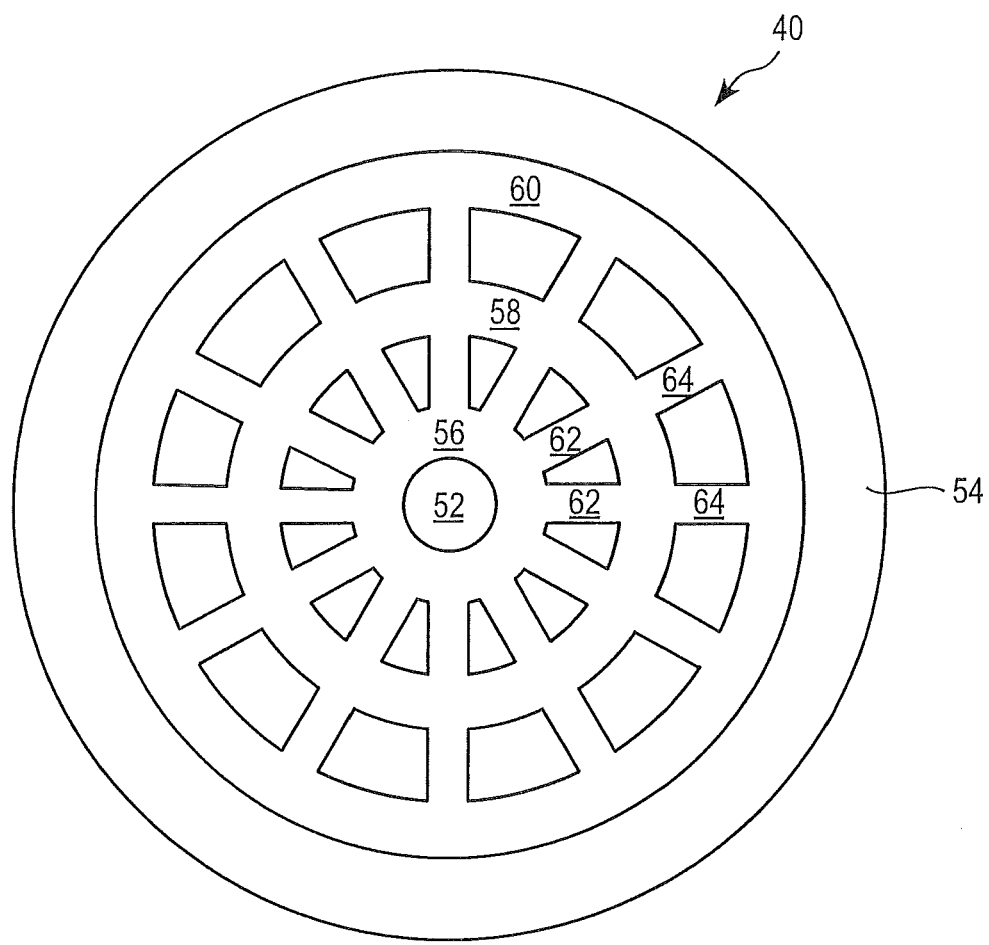
FIG. 2 is a bottom plan view of the top electrode of the showerhead electrode assembly shown in FIG. 1.

In the embodiment, the top electrode 40 includes a single gas inlet 52 in fluid communication with a gas manifold formed in the showerhead electrode 24. The gas manifold includes at least one plenum formed in the bottom surface 54 of the top electrode 40. In embodiments including more than one plenum, the plenums are in fluid communication with each other. In the embodiment, the gas manifold includes three plenums; namely, a first plenum 56, which is preferably centrally-located on the bottom surface 54, and a second plenum 58 and third plenum 60 radially spaced from the first plenum 56. In other embodiments, the top electrode 40 can include only a single plenum, or alternatively more than two plenums, surrounding the first plenum 56. As shown in FIG. 2, the first plenum 56 has a circular shape, and the second plenum 58 and third plenum 60 are concentric annular channels. The top electrode 40 includes circumferentially-spaced, radial gas passages 62 to provide fluid communication between the first plenum 56 and second plenum 58, and circumferentially-spaced, radial gas passages 64 to provide fluid communication between the second plenum 58 and third plenum 60. In the embodiment, the radial gas passages 62, 64 are aligned. The gas inlet 52, plenums 56, 58, 60 and radial gas passages 62, 64 can be machined in the top electrode 40.

The first plenum 56, second plenum 58 and third plenum 60 have suitable volumes to achieve desired gas pressure conditions. For example, the second plenum 58 can have a volume greater than that of the first plenum 56, and the third plenum 60 can have a volume greater than that of the second plenum 58. The top electrode 40 and bottom electrode 42 can have about the same thickness or different thicknesses.

Figure 3:
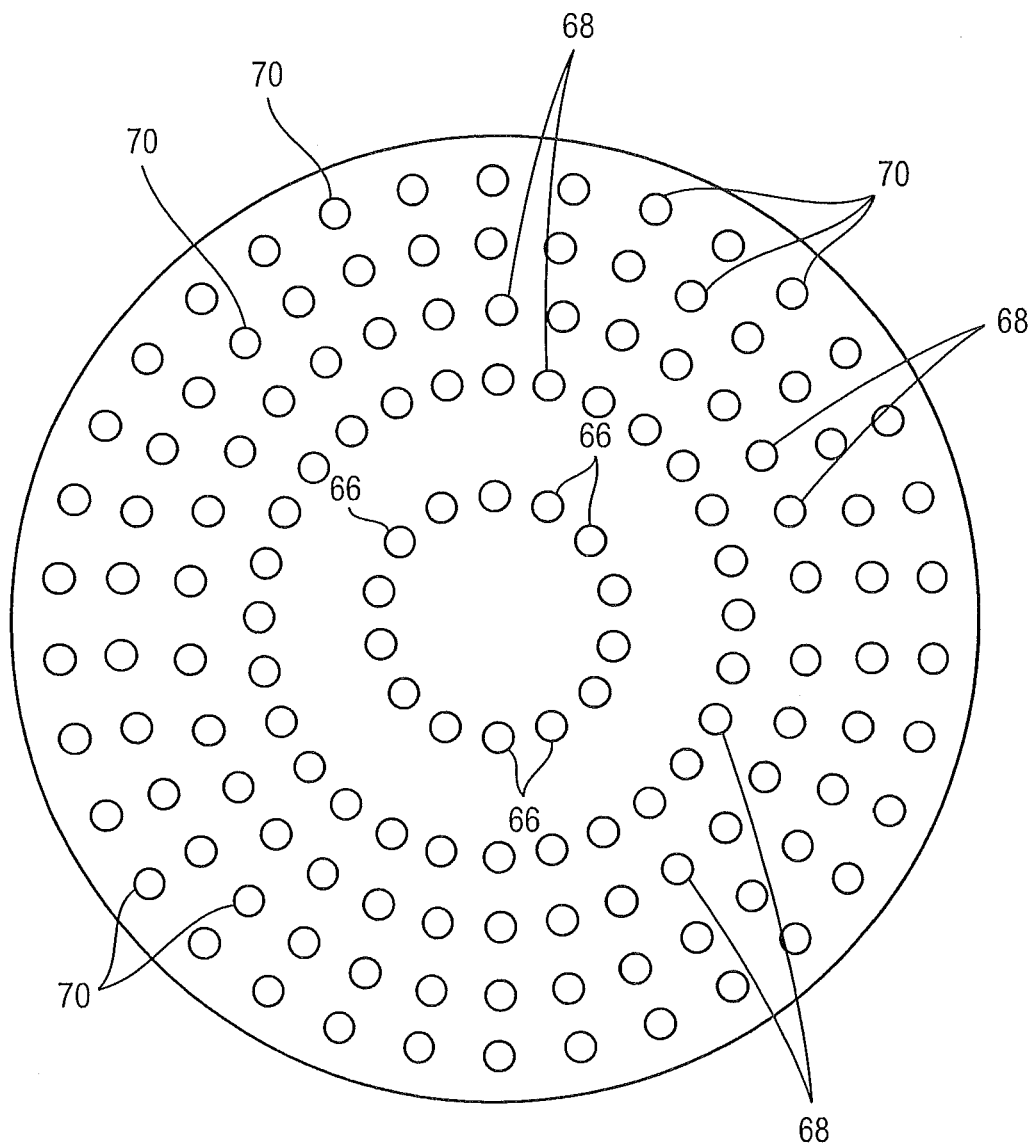
FIG. 3 is a bottom plan view of the bottom electrode of the showerhead electrode assembly shown in FIG. 1.

The gas manifold is configured to supply gas simultaneously to gas holes in the bottom electrode 42. As shown in FIGS. 1 and 3, the bottom electrode 42 includes gas holes 66, 68, 70 extending therethrough and arranged in concentric circles, with each respective group of gas holes 66, 68, 70 including a plurality of circumferentially-spaced gas holes. The gas holes 66 are in fluid communication with the first plenum 56, the two groups of gas holes 68 are in fluid communication with the second plenum 58, and the two groups of gas holes 70 are in fluid communication with the third plenum 60. In other embodiments, the bottom electrode 42 can include a single group, or more than two groups, of the gas holes 68, 70 in fluid communication with the respective second plenum 58 and/or third plenum 60. In the embodiment, the plenums 56, 58, 60 provide a gas flow zone. In other embodiments, the showerhead electrode assembly 20 can include more than one gas flow zone, e.g., at least an inner gas flow zone and an outer gas flow zone surrounding the inner gas flow zone. For example, the inner gas flow zone can be limited to a particular radius of the showerhead electrode and the outer gas flow zone can repeat the inner gas flow zone for an adjacent radial portion of the showerhead electrode. Multiple gas flow zones allow independent gas flow control between center and edge (or mid-range) portions of the substrate 32.

The top electrode 40 and bottom electrode 42 can be composed of any suitable semiconductor material, such as single crystal silicon, polycrystalline silicon, SiC, SiN and the like. The top electrode 40 and bottom electrode can be composed of different materials. High-purity, single crystal silicon minimizes contamination of substrates, and also wears smoothly, during plasma processing, thereby minimizing particles. Preferably, the top electrode 40 and bottom electrode 42 are composed of single crystal silicon and diffusion bonded to each other. Preferably, no foreign bonding material other than silicon or silicon oxide is used between the top electrode 40 and bottom electrode 42. Thus, the diffusion-bonded showerhead electrode provides advantages with regard to reduced wafer contamination as compared to using such other foreign bonding materials.

In the embodiment, the top plate 21 is preferably liquid cooled to control its temperature. For example, the top plate 21 can include one or more liquid passages in fluid communication with a temperature-controlled liquid supply 72 via a liquid passage 73, as shown in FIG. 1. The cooling liquid, e.g., water, can typically have a temperature of about 17° C. to about 20° C. The top plate 21 preferably does not include a built-in heater.

As shown in FIG. 1, a gap 76 (i.e., open space) is defined between the bottom surface 50 of the top plate 21 and the top surface 48 of the top electrode 40. RF energy from the plasma arriving at showerhead electrode 24 can be capacitively-coupled to the showerhead electrode 24 across the gap 76 to the top plate 21, which represents RF ground. Seals 78, 80, such as O-rings or the like, are located between the bottom surface 50 and top surface 48 to form pressure-tight gas seals. The seal 78 isolates the gap 76 from the process gas inlet 52, and the seal 80 isolates the gap 76 from outer parts of the plasma processing chamber 10. Additional seals can be provided between the top plate 21 and top electrode 40 to allow multiple-process gas zone injection, or multiple-zone temperature control of the showerhead electrode 24. One additional seal can be added for each process gas zone.

The showerhead electrode assembly 20 includes rollers 82 located between the bottom surface 50 of the top plate 21 and the top surface 48 of the top electrode 40. The rollers 82 are provided to maintain a pre-set height of the gap 76 and also accommodate thermal expansion of the showerhead electrode assembly 20. The rollers 82 are seated in recesses formed in the bottom surface 50 of the top plate 21. For example, three or more of the rollers 82 received in respective recesses can be arranged in a circle. The rollers 82 are preferably spheres, which can rotate to minimize frictional contact with the top plate 21 and top electrode 40 during thermal expansion of the showerhead electrode assembly 20.

The rollers 82 can comprise any suitable material including metals, such as stainless steels, ceramics and polymers, such as polytetrafluoroethylene. In embodiments that include metallic rollers 82, it may be desirable in some applications to provide an electrical insulator in the recesses to prevent electrical contact between the top plate 21 and the metallic rollers.

The gap 76 between the bottom surface 50 of the top plate 21 and the top surface 48 of the top electrode 40 preferably has a height of about 25 µm to about 150 µm, such as about 50 µm to about 100 µm. The bottom surface 50 and top surface 48 are preferably very smooth and planar to maintain a constant height of the gap 76 radially across the entire gap.

In the embodiment, the showerhead electrode 24 is flexibly suspended from the top plate 21 by the brackets 46. The exemplary L-shaped support brackets 46 shown in FIG. 1 include a bottom portion 84 on which the bottom electrode 42 of the showerhead electrode 24 rests. Preferably, only the bottom portions 84 of the support brackets 46 contact the showerhead electrode 24. The support brackets 46 comprise a material that is sufficiently thin and flexible to accommodate thermal expansion and/or contraction of the showerhead electrode assembly 20 with minimal rubbing action between the support brackets 46 and the top plate 21. During such thermal expansion and/or contraction, the brackets 46 can flex laterally (i.e., radially). For example, the support brackets 46 can comprise a metallic material, which can provide DC conduction between the top plate 21 and showerhead electrode 24. To minimize the possibility of chamber contamination by the brackets, any plasma-exposed surface(s) of the brackets can be coated with a material that is corrosion and wear-resistant, as well as contamination-neutral, such as quartz, yttria, silicon, silicon carbide, alumina, or a polymeric material.

In the embodiment, the showerhead electrode assembly 20 is adapted to be used in combination with elements for heating or cooling the showerhead electrode 24 to control the temperature of the showerhead electrode 24 when the plasma is OFF (e.g., during tool-idle and wafer transport periods) and when the plasma is ON during production wafer processing. The heating and cooling elements are spatially separated from the showerhead electrode 24 to eliminate physical contact of these features with the showerhead electrode 24. The showerhead electrode assembly 20 does not include a thermal control device (e.g., a resistive heater or high-temperature chiller) in physical contact with the showerhead electrode 24. By spatially separating the heating and cooling elements from the showerhead electrode 24 in the showerhead electrode assembly 20, the possibility of particle contamination caused by physical contact, such as sliding contact, between the heating and cooling elements and the showerhead electrode 24 is eliminated.

In the embodiment, a heat transfer gas supply section including a heat transfer gas supply 86 is arranged in fluid communication with the gap 76 defined between the top plate 21 and top electrode 40 via a gas line 88 and a gas passage 90 in the top plate 21. The showerhead electrode 24 can reach temperatures as high as about 160° C. to about 170° C. during plasma processing when high power levels are used to generate plasma. The heat transfer gas supply section is operable to supply the heat transfer gas from the heat transfer gas supply 86 to fill the gap 76. The heat transfer gas is confined in the gap 76 in the region defined between the bottom surface 50 of the top plate 21, the top surface 48 of the top electrode 40 and the seals 78, 80. The heat transfer gas is preferably helium, which has high mobility to transfer heat. Heat is conducted from the bottom electrode 42 to the top electrode 40 and to the heat transfer gas to control the temperature of the bottom electrode 42. Preferably, the heat transfer gas is supplied into the gap 76 only when the plasma is ON in the plasma processing chamber 10 to transfer heat from the showerhead electrode 24 to offset heating effects of the plasma, and the heat transfer gas is evacuated from the gap 76 when the plasma is OFF.

To evacuate the heat transfer gas from the gap 76, the heat transfer gas supply section includes a valve 92 and vacuum pump 94 arranged along the gas line 88 to evacuate the heat transfer gas from the gap 76 via the gas passage 90 and gas line 88.

As shown in FIG. 1, in the embodiment, a heating gas supply section including a heating gas supply 96 is also arranged in fluid communication with the showerhead electrode 24 via a gas line 98 and the gas passage 30 in the top plate 21. The heating gas supply section includes a heater 100 arranged along the gas line 98 to pre-heat the heating gas to a desired temperature before being supplied to the showerhead electrode 24. The heater 100 is located outside of the vacuum and the RF return path of the plasma processing chamber 10. The heating gas is pre-heated to a sufficiently-high temperature, e.g., about 100° C. to about 500° C., and supplied with a sufficiently-high flow rate, e.g., at least about 2000 sccm, to heat the showerhead electrode to a desired temperature. The heating gas preferably has a high specific heat and can be $C_4F_8$, nitrogen or the like. The heating gas is supplied from the heating gas supply 96 via the gas line 98 and gas passage 30 to the first plenum 56 and distributed to the second plenum 58 and third plenum 60 via the radial gas passages 62, 64, and from there distributed to the gas holes 66, 68, 70 in the bottom electrode 42. The heating gas is effective to heat the showerhead electrode 24 to control its temperature.

Preferably, the heating gas is supplied to heat the showerhead electrode 24 only when the plasma is OFF. The supply of heating gas is terminated before production wafers are processed. The heating gas supply section optionally also includes a valve 102 and a vacuum pump 104 arranged along the gas line 98 to evacuate the heating gas from the gas passage 30 before supplying process gas to the showerhead electrode 24 from the process gas supply 28. In another embodiment, a vacuum pump in the plasma processing chamber 10 can be operated to evacuate the heating gas prior to the beginning of the process.

The operation of the process gas supply 28, heating gas supply 96, heater 100, valve 102, vacuum pump 104, heat transfer gas supply 86, valve 92 and vacuum pump 94 before and during plasma processing operations can be controlled by a controller connected to these elements to enable efficient supply and removal of the process gas, heating gas and heat transfer gas to and from the showerhead electrode 24.

The showerhead electrode assembly 10 can optionally include temperature sensing features to monitor the temperature of the showerhead electrode 24. For example, temperature feedback based on contact-less photoluminescence can be used. Such temperature sensing features can be contained by additional seals, such as O-rings.

In the embodiment, the confinement ring assembly 36 comprises, in a concentric arrangement, a mounting ring 106 and plasma confinement rings 108 suspended from the mounting ring 106 by a hanger 110. The mounting ring 106 and plasma confinement rings 108 can be vertically-movable to provide adjustment of the size of gas passages between adjacent ones of the confinement rings. The number of plasma confinement rings of the assembly is not limited to four rings, as shown; alternatively, there can be less than four rings, e.g., three rings, or more than four rings, e.g., five, six or more rings. The mounting ring 106 and the plasma confinement rings 108 are comprised of a suitable dielectric material. The insulating material can be, for example, quartz, fused silica, silicon nitride, alumina, or a plastic material.

Exemplary plasma confinement ring assemblies that can be used in the plasma processing chamber 10 are disclosed in commonly-owned U.S. Pat. Nos. 5,534,751; 5,998,932; 6,019,060; 6,178,919 and 6,527,911, and U.S. Patent Application No. 2006/0207502, each of which is incorporated herein by reference in its entirety.

In the embodiment shown in FIG. 1, the showerhead electrode 24 has an outer diameter exceeding the diameter of the substrate 32 by a significant amount so that polymer flakes or particles that may become dislodged from contact surfaces between the brackets 46 and the bottom electrode 42 will not land on the substrate 32, but will land outside of the substrate 32 area to avoid contamination of the substrate 32. Preferably, the diameter of the showerhead electrode 24 exceeds the diameter of the substrate 32 by at least about 2 inches (about 50 mm), such as about 3 inches (about 75 mm). In an exemplary embodiment, the showerhead electrode 24 has an outer diameter of about 15 inches (about 380 mm) for processing substrates having a 300 mm diameter (about 12 inches). However, the showerhead electrode 24 can be sized to process other wafer sizes, or substrates of various sizes having a non-circular configuration.

As shown in FIG. 1, the showerhead electrode assembly 20 can be electrically grounded to provide a return path for power supplied by the lower electrode 26 of the substrate support assembly 22. The lower electrode 26 can be an electrostatic chuck operable to secure the substrate 32 on the upper surface 34 by an electrostatic clamping force. In an embodiment, the showerhead electrode 24 is grounded, and power at one, two or more frequencies is applied to the lower electrode 26 to generate plasma in the plasma processing chamber 10. For example, the lower electrode 26 can be powered at frequencies of 2 MHz and 27 MHz by two independently-controlled RF power supplies 114, 116. After substrate 32 has been processed, the supply of power to the lower electrode 26 is shut off to terminate plasma generation.

In an exemplary embodiment, plasma is generated in the plasma processing chamber 10 to process a first substrate 32 (e.g., by etching). During the plasma processing of the substrate 32, process gas is supplied to the showerhead electrode 24 from the process gas supply 28 via gas line 118 and the gas passage 30 in the top plate 21. A valve and pump arrangement can be provided along the gas line 118 to pump the process gas from the gas passage 30 when the plasma is OFF. The process gas is distributed by the gas manifold in the showerhead electrode 24 to the gas holes 66, 68, 70 and injected into the plasma confinement zone 38 of the plasma processing chamber 10.

During the plasma processing, heat transfer gas is also supplied into the gap 76 from the heat transfer gas supply 86 via the gas line 88 and gas passage 90 in the top plate 21 to cool the showerhead electrode 24.

After the first substrate 32 has been processed, the supply of power to the lower electrode 26 is shut off to terminate plasma generation. The processed substrate is removed from the plasma processing chamber 10. When the plasma is OFF, the heat transfer gas is evacuated from the gap 76 by operating the pump 94. Heating gas is then supplied from the heating gas supply 96 to the showerhead electrode 24 via the gas line 98 and gas passage 30 in the top plate 21. The heating gas is effective to maintain the showerhead electrode 24 temperature above a minimum temperature when the plasma is OFF. The showerhead electrode 24 temperature is preferably maintained at approximately a constant temperature between successive substrate processing runs so that "first wafer effects" can be minimized during production wafer processing, and substrates can be processed more uniformly, thereby improving process yields.

Next, a second substrate 32 is placed on the substrate support assembly 22 for plasma processing. The supply of heating gas from the heating gas supply 96 is stopped before the substrate 32 is processed. The pump 104 is activated to evacuate the heating gas from the gas passage 30 before supplying process gas to the showerhead electrode 24 from the process gas supply 28. Power is again supplied to the lower electrode 26 to generate plasma in the plasma processing chamber 10. Once plasma generation has been re-started, heat transfer gas is again supplied to the gap 76 from the heat transfer gas supply 86.

While the invention has been described in detail with reference to specific embodiments thereof, it will be apparent to those skilled in the art that various changes and modifications can be made, and equivalents employed, without departing from the scope of the appended claims.

What is claimed is:

1. A showerhead electrode for a semiconductor material processing apparatus, comprising:
    a top electrode of semiconductor material comprising a top surface, a gas inlet at the top surface and a bottom surface, the bottom surface including a first central plenum and a second annular plenum in fluid communication with the gas inlet; and
    a bottom electrode of semiconductor material comprising a top surface bonded to the bottom surface of the top electrode, a plasma-exposed bottom surface, and a plurality of gas holes in fluid communication with the first and second plenums;
    wherein the second plenum is concentric with the first plenum.

2. The showerhead electrode of claim 1, wherein the top and bottom electrodes comprise single crystal silicon, polycrystalline silicon, SiC or SiN.

3. The showerhead electrode of claim 1, wherein each of the top and bottom electrodes comprises single crystal silicon, the top surface of the bottom electrode is diffusion bonded to the bottom surface of the top electrode, and only silicon or silicon oxide is between the bottom surface of the top electrode and the top surface of the bottom electrode.

4. The showerhead electrode of claim 1, wherein:
    the second plenum is an annular channel spaced radially outward from the first plenum and in fluid communication with the first plenum via a plurality of first radial gas passages; and
    the bottom electrode includes first gas holes in fluid communication with the first plenum and second gas holes in fluid communication with the second plenum.

5. The showerhead electrode of claim 4, further comprising:
    a third plenum spaced radially outward from the second plenum and in fluid communication with the second plenum via a plurality of second radial gas passages and with the first plenum; and
    third gas holes in the bottom electrode in fluid communication with the third annular plenum;
    wherein the third plenum is an annular channel in the bottom surface of the top electrode, the second plenum having a volume greater than the first plenum and the third plenum having a volume greater than the second plenum.

6. The showerhead electrode of claim 4, wherein the bottom electrode includes one row of circumferentially spaced gas holes in fluid communication with the first plenum and two rows of circumferentially spaced gas holes in fluid communication with the second plenum.

7. The showerhead electrode of claim 5, wherein the bottom electrode includes two rows of circumferentially spaced gas holes in fluid communication with the third plenum.

8. The showerhead electrode of claim 1, wherein the top electrode includes only one gas inlet.

9. The showerhead electrode of claim 5, wherein the third plenum is concentric with the first and second plenums.

* * * * *